United States Patent [19]

Ishii

[11] Patent Number: 5,860,455
[45] Date of Patent: Jan. 19, 1999

[54] LEAD BENDING MACHINE FOR ELECTRONIC COMPONENTS

[75] Inventor: Mitoshi Ishii, Ohita, Japan

[73] Assignee: Ishii Tool & Engineering Corp., Ohita, Japan

[21] Appl. No.: 940,950

[22] Filed: Sep. 30, 1997

[30] Foreign Application Priority Data

Nov. 29, 1996 [JP] Japan ..................................... 8-334503

[51] Int. Cl.$^6$ ................................................. B21F 01/00
[52] U.S. Cl. ............................................................ 140/105
[58] Field of Search ............................................ 140/105

[56] References Cited

U.S. PATENT DOCUMENTS 5,283,946  2/1994  Simmons et al. ........................ 140/105

Primary Examiner—Lowell A. Larson
Attorney, Agent, or Firm—Armstrong, Westerman, Hattori, McLeland & Naughton

[57] ABSTRACT

A general-purpose lead bending machine for electronic components that is capable of bending leads of various types of electronic components without a need of a great variety of benders. The machine includes a lead holding device for holding the distal end of a lead of an electronic component. A first driving mechanism causes the lead holding device to move along a first axis of travel. A second driving mechanism causes the lead holding device to move along a second axis of travel perpendicularly intersecting the first axis of travel. A control device controls the first driving mechanism and the second driving mechanism such that the lead holding device holding the lead of the electronic component moves along an approximately circular arc-shaped locus, thereby bending the lead of the electronic component.

6 Claims, 8 Drawing Sheets

LEAD BENDING MACHINE FOR ELECTRONIC COMPONENTS

BACKGROUND OF THE INVENTION

1. Field of the Invention

The present invention relates to a lead bending machine for electronic components that is capable of bending leads of electronic components without straining the electronic components by causing the leads to move along a circular arc. More particularly, the present invention relates to a lead bending machine for electronic components that is capable of dealing with a great variety of electronic components varying in shape from each other.

2. Description of the Background Art

In general, bending of leads of electronic components, e.g. LSIs, is carried out by press working, and there have been cases where excessive force applied to an LSI package or gold wire for bonding may cause damage to these portions. Accordingly, the present inventor proposed an apparatus wherein the leads of electronic components are bent by causing the leads to move along a circular arc using a bender comprising a movable punch and a movable die as in Japanese Patent Application Post-Examination Publication No. 7-95576.

The conventional apparatus that uses a bender as in Japanese Patent Application Post-Examination Publication No. 7-95576 suffers from the problem that because there are a great variety of electronic components varying in the shape, length and bend dimensions of leads, it is necessary to use a special-purpose bender for each type of electronic components. Therefore, a large number of different types of benders are needed, and an increase in the cost of benders causes the working cost to increase. Moreover, the conventional apparatus has the disadvantage that it takes a great deal of time to cope with the demand for bending the leads of a new type of electronic components because the production of a bender takes a long time. In addition, during the actual working operation, it takes a great deal of time and labor to change benders according to the type of electronic components, and this causes the working efficiency to decrease.

SUMMARY OF THE INVENTION

Accordingly, an object of the present invention is to provide a general-purpose lead bending machine for electronic components that is capable of bending leads of various types of electronic components without a need of a great variety of benders.

To attain the above-described object, the present invention provides a lead bending machine for electronic components which includes a lead holding device for holding the distal end of a lead of an electronic component, and a first driving mechanism that causes the lead holding device to move along a first axis of travel. The lead bending machine further includes a second driving mechanism that causes the lead holding device to move along a second axis of travel perpendicularly intersecting the first axis of travel, and a control device for controlling the first driving mechanism and the second driving mechanism such that the lead holding device holding the lead of the electronic component moves along an approximately circular arc-shaped locus, thereby bending the lead of the electronic component.

In the above-described lead bending machine for electronic components, the lead holding device preferably includes a first lead holding member and a second lead holding member, which are movable toward and away from each other.

It is preferable that the first driving mechanism should include a ball screw and a ball nut, and that the second driving mechanism should include a ball screw and a ball nut for driving the first lead holding member, and further that the lead bending machine should have a cylinder device that urges the second lead holding member toward the first lead holding member.

It is preferable for the lead bending machine to include a lead support device for supporting the root portion of the lead of the electronic component in a fixed state.

It is preferable for the lead support device to include a lead support fixed member whose position is fixed, and a lead support movable member movable toward and away from the lead support fixed member.

It is preferable for the lead bending machine to include a third driving mechanism that causes the lead support movable member to move toward the lead support fixed member along the second axis of travel.

It is preferable that the third driving mechanism should include a ball screw and a ball nut, and that the ball screw of the second driving mechanism and the ball screw of the third driving mechanism should be integral with each other and have respective threads cut thereon in inverse relation to each other with the same pitch.

It is preferable for the lead bending machine to include an input device for inputting dimensions of a bend shape of the lead of the electronic component, and a computing device for arithmetically determining a lead holding position of the lead holding device and a circular arc-shaped locus of travel from data concerning the dimensions inputted from the input device.

Other objects and advantages of the present invention will become apparent from the following description taken in connection with the accompanying drawings.

DETAILED DESCRIPTION OF THE EMBODIMENTS

Figure 1:
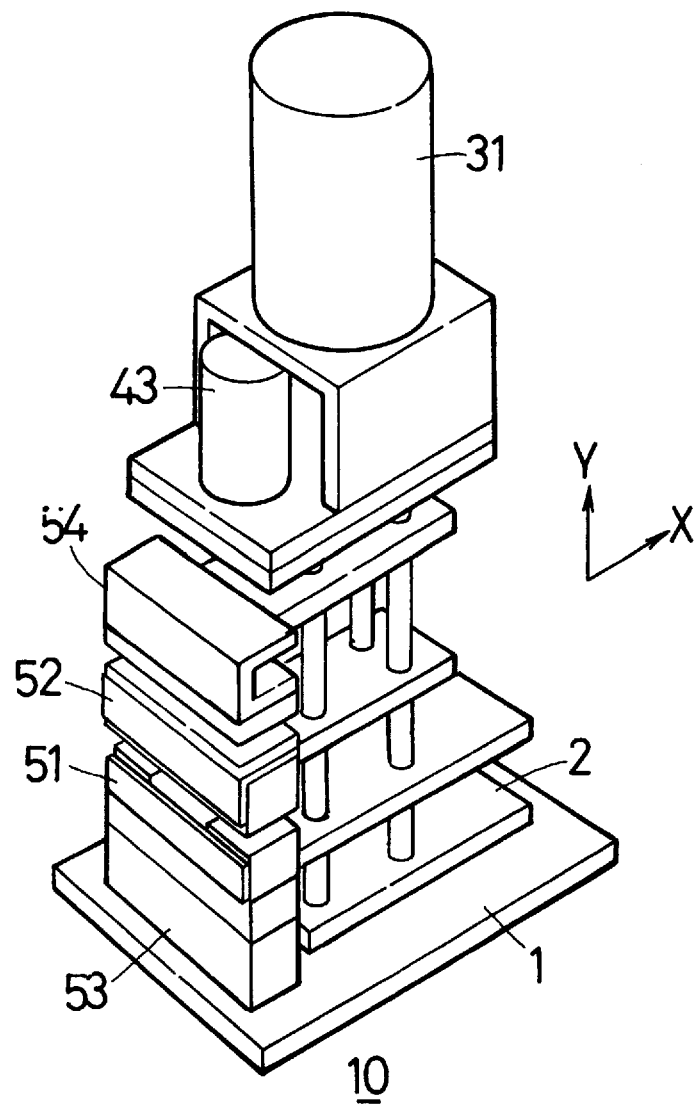
FIG. 1 is a general perspective view of a lead bending machine for electronic components according to the present invention.

An embodiment of the present invention will be described below with reference to the accompanying drawings. FIG. 1 is a general perspective view of a lead bending machine for electronic components according to the present invention. A base 1 is fixed on a base block 10 installed on the floor surface in a plant or the like. A moving plate 2 is installed on the base 1 so as to be movable in one direction on a horizontal plane. The direction of the movement is assumed to be an X-axis direction. A lead support block 53 is also fixed on the base 1. A lead support device including a lead support fixed member 51 and a lead support movable member 52 is installed on the lead support block 53. The X-axis direction is set to be a direction in which the moving plate 2 moves toward and away from the lead support device. Leads of an electronic component are positioned and fixedly placed on a table (not shown in the figure). The leads of the electronic component are supported by clamping the root portions of the leads between the lead support fixed member 51 and the lead support movable member 52 from the upper and lower sides thereof.

Figure 2:
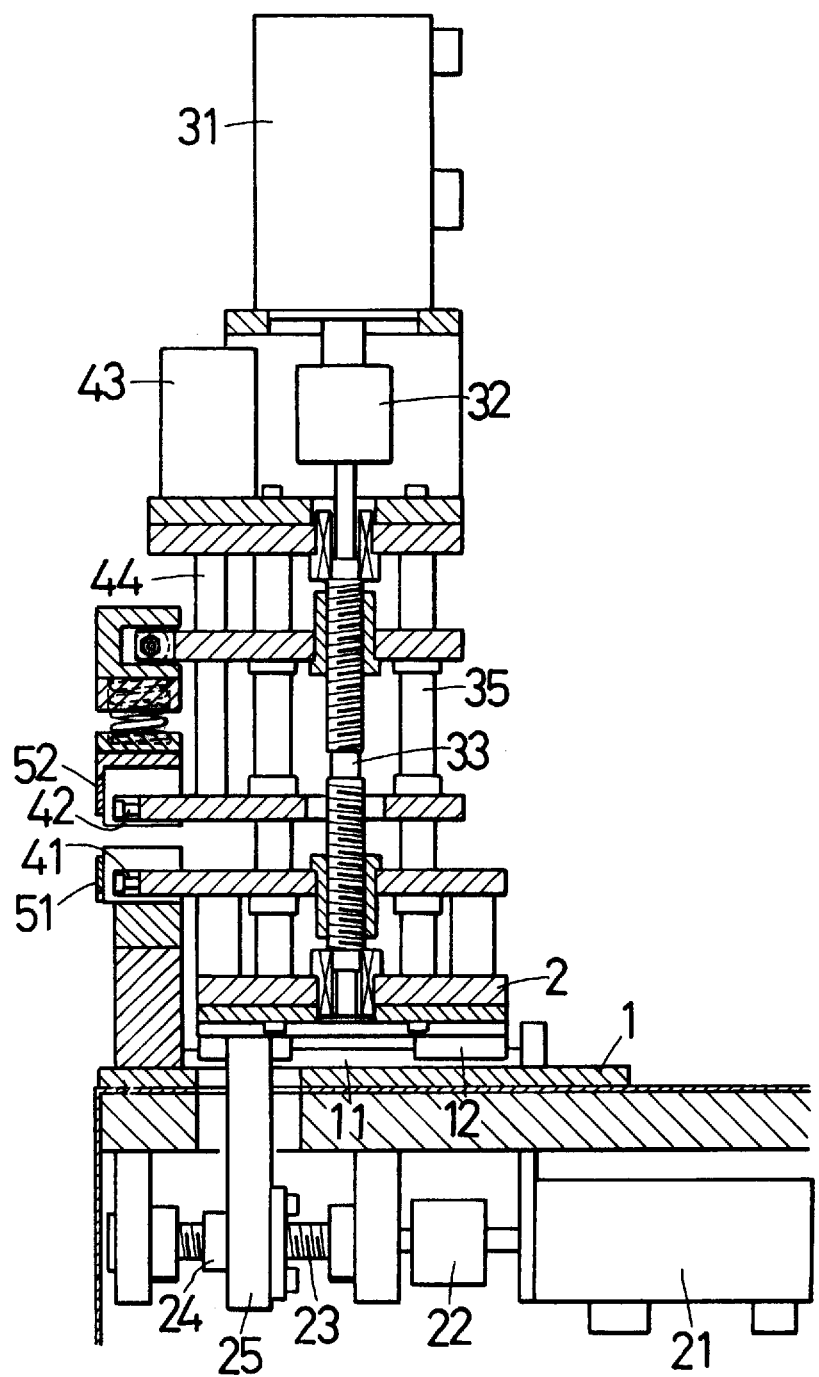
FIG. 2 is a sectional side view of the lead bending machine for electronic components.

FIG. 2 is a sectional side view of the lead bending machine for electronic components. An X-axis guide 11 is provided to extend in the X-axis direction on the base 1. An X-axis slider 12 is guided on the X-axis guide 11 so as to be movable in the X-axis direction. The X-axis slider 12 is secured to the lower surface of the moving plate 2, thereby enabling the moving plate 2 to move smoothly in the X-axis direction. The moving plate 2 is driven in the X-axis direction by the power of an X-axis servomotor 21. An output shaft of the X-axis servomotor 21 is connected to an X-axis ball screw 23 through an X-axis coupling 22, and thus rotation of the output shaft is transmitted to the X-axis ball screw 23. The X-axis ball screw 23 has an X-axis ball nut 24 screwed thereon. The X-axis ball nut 24 is nonrotatably secured to the moving plate 2 through a connecting member 25. Accordingly, the moving plate 2 is driven rectilinearly in the X-axis direction by the rotation of the X-axis servomotor 21.

The leads of the electronic component are held at their distal end portions between a lower lead holding member 41 and an upper lead holding member 42 and bent into a predetermined shape. At this time, the root portions of the leads are clamped between the lead support fixed member 51 and the lead support movable member 52 and thus immovably supported. The lower lead holding member 41 and the lead support movable member 52 are driven in a Y-axis direction, which is a vertical direction, by a Y-axis servomotor 31. An output shaft of the Y-axis servomotor 31 is connected to a Y-axis ball screw 33 through a Y-axis coupling 32. The upper lead holding member 42 is driven in the Y-axis direction by a cylinder device 43 through a cylinder shaft 44.

Figure 3:
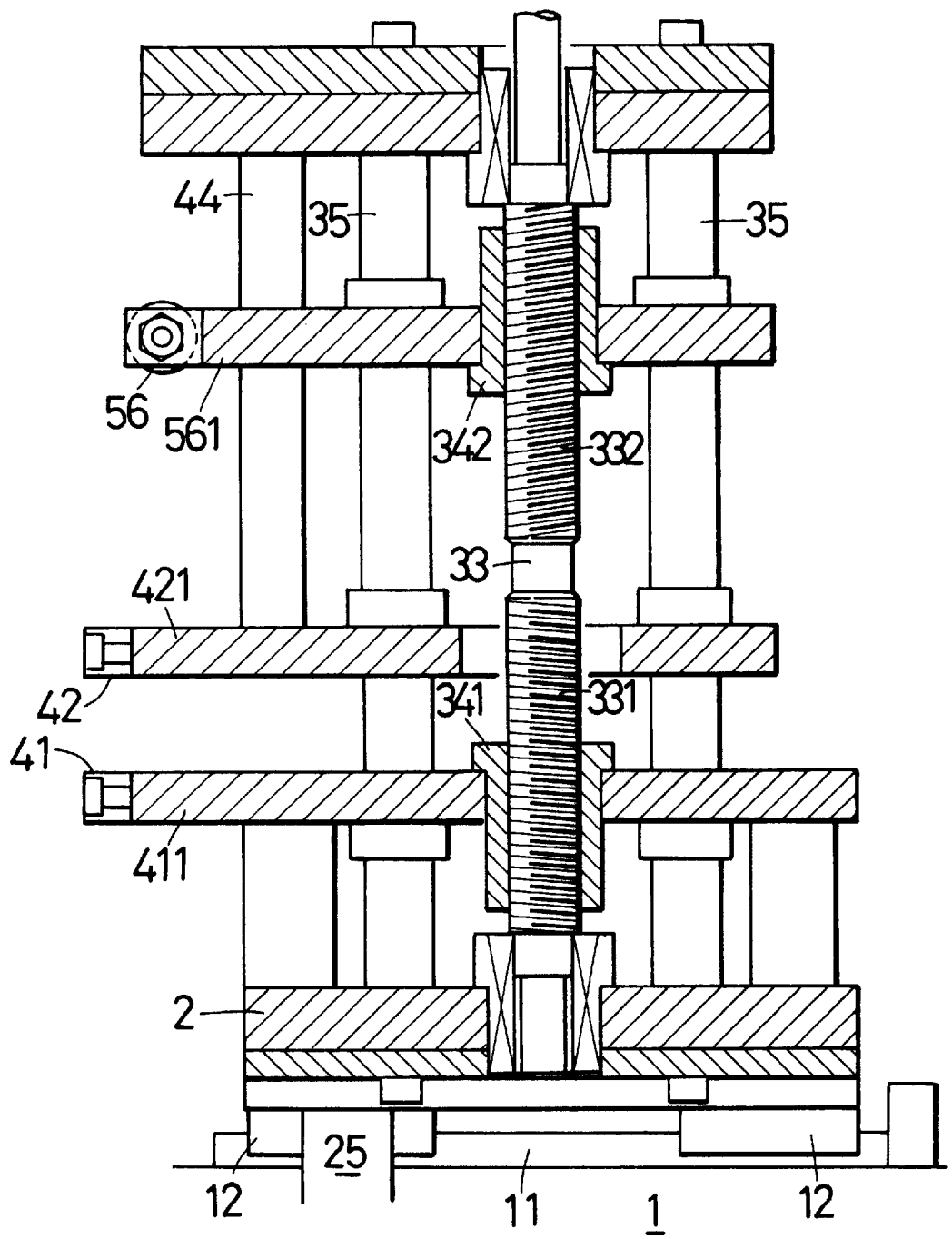
FIG. 3 is an enlarged view of a Y-axis direction driving mechanism for lead holding members and a driving mechanism for lead support members.

FIG. 3 is an enlarged view showing the Y-axis direction driving mechanism for the lower lead holding member 41 and the upper lead holding member 42, together with the lead support movable member 52. Four vertical Y-axis guides 35 are fixed on the moving plate 2. The Y-axis guides 35 have a columnar shape and guide a lower moving plate 411, an upper moving plate 421 and a roller retaining plate 561 in the Y-axis direction. The Y-axis ball screw 33, which is driven by the Y-axis servomotor 31, has a lower ball screw 331 and an upper ball screw 332 in the lower and upper portions, respectively, of the central part of the Y-axis ball screw 33. The lower ball screw 331 and the upper ball screw 332 have respective threads cut thereon in inverse relation to each other with the same pitch.

The lower ball screw 331 has a lower ball nut 341 screwed thereon. The lower ball nut 341 is nonrotatably secured to the lower moving plate 411. The lower lead holding member 41 is secured to the distal end portion of the lower moving plate 411. Accordingly, the lower lead holding member 41 can be moved in the Y-axis direction by rotatively driving the Y-axis ball screw 33 by the Y-axis servomotor 31. The upper ball screw 332 has an upper ball nut 342 screwed thereon. The upper ball nut 342 is nonrotatably secured to the roller retaining plate 561. A driving roller 56 is rotatably supported at the distal end portion of the roller retaining plate 561. Accordingly, the driving roller 56 can be moved in the Y-axis direction by rotatively driving the Y-axis ball screw 33 by the Y-axis servomotor 31.

Because the lower ball screw 331 and the upper ball screw 332 have respective threads cut thereon in inverse relation to each other, the rotation of the Y-axis ball screw 33 causes the driving roller 56 and the lower lead holding member 41 to move vertically through equal distances in opposite directions to each other. The driving roller 56 is engaged in an engagement groove 541 of an engagement member 54. By moving the driving roller 56 in the Y-axis direction, the lead support movable member 52 can be urged toward the lead support fixed member 51 through a spring 55. The engagement mechanism of the driving roller 56 and the engagement groove 541 is adapted to urge the lead support movable member 52 independently of the movement in the X-axis direction of the moving plate 2. The engagement groove 541 absorbs the movement in the X-axis direction of the moving plate 2.

The upper moving plate 421, which has the upper lead holding member 42 secured to the distal end portion thereof, is driven to press in the Y-axis direction by the cylinder device 43 through the cylinder shaft 44. Consequently, the upper lead holding member 42 is urged toward the lower lead holding member 41. In a state where the upper lead holding member 42 is urged toward the lower lead holding member 41 by an air pressure or the like, when the lower lead holding member 41 moves, the upper lead holding member 42 also moves together with it so as to follow the movement of the lower lead holding member 41 while being held in the urged state.

Figure 4:
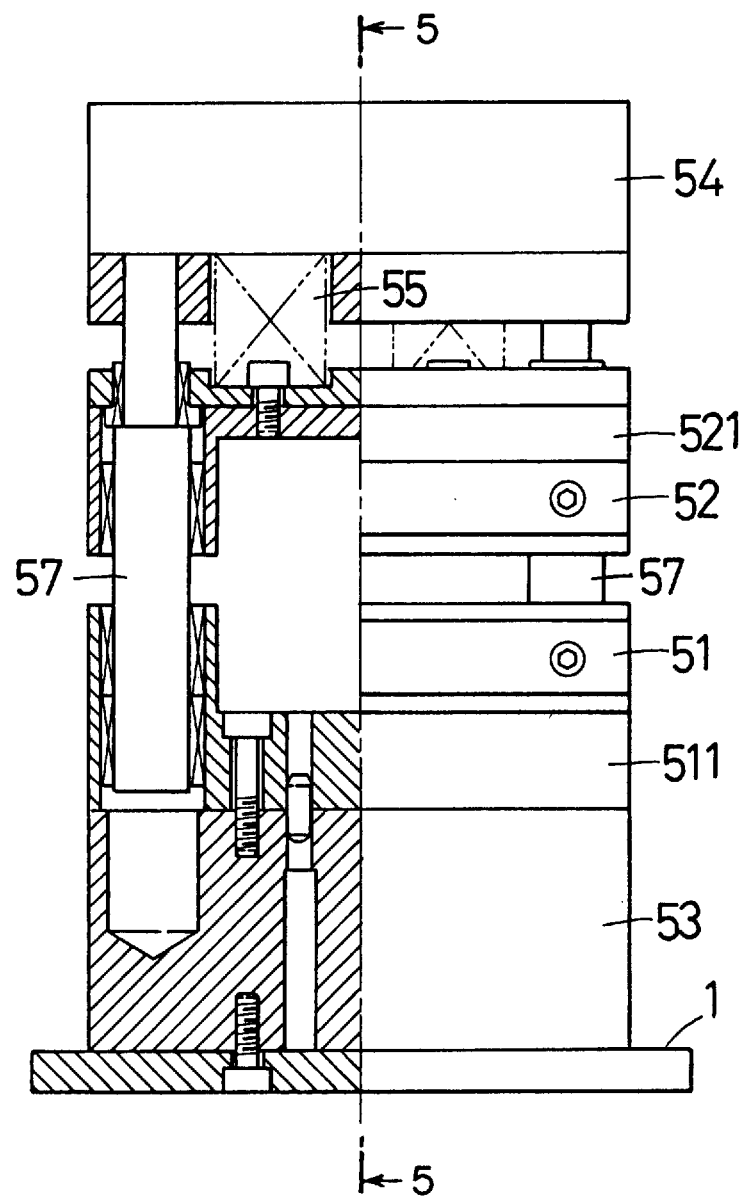
FIG. 4 is an enlarged front view of the lead support members.
Figure 5:
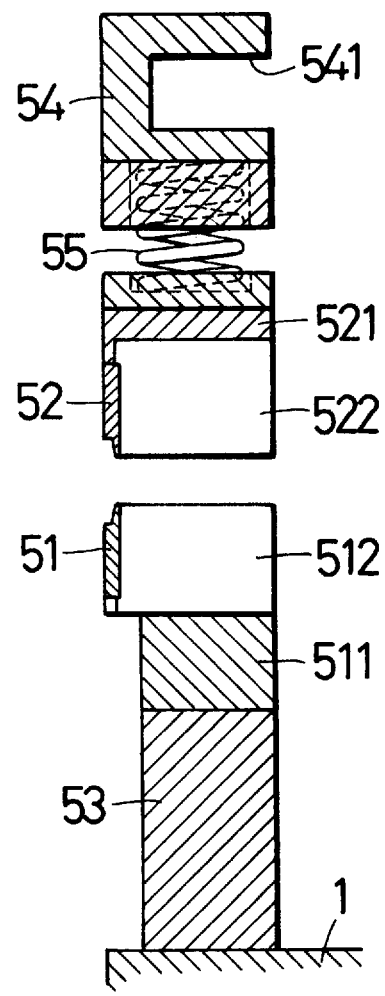
FIG. 5 is a sectional view of the lead support members as seen from the arrow A—A in FIG. 4.

FIG. 4 is an enlarged front view of the lead support device for fixedly supporting the root portions of leads of an electronic component during the bending of the leads, in which a part of the lead support device is shown in a sectional view. FIG. 5 is a sectional view of the lead support device as seen from the arrow A—A in FIG. 4. The lead support device is installed on the lead support block 53. The lead support block 53 is fixedly installed on the base 1. The lead support device comprises the lead support fixed member 51, which is a lower member whose position is fixed, and the lead support movable member 52, which is an upper member. As has been stated above, the lead support movable member 52 is urged toward the lead support fixed member 51 by the Y-axis servomotor 31 and the Y-axis ball screw 33.

Guide bars 57 are secured to the engagement member 54 in such a manner as to extend in the Y-axis direction. An upper lead support member mounting part 521 and a lower lead support member mounting part 511 are fitted on the guide bars 57 so as to be movable relative to each other. The guide bars 57 enable the engagement member 54 and the lead support movable member 52 to move in the Y-axis direction and guide them with respect to the lead support fixed member 51. By lowering the driving roller 56 engaged in the engagement groove 541, the engagement member 54 is moved downwardly, and further, the lead support movable member 52 is moved downwardly through the spring 55, thereby fixedly supporting the root portions of the leads. Even after the lead support movable member 52 has come in contact with the lead root portions, the engagement member 54 is further moved downwardly until the supporting force from the spring 55 reaches a predetermined magnitude.

The upper lead support member mounting part 521 and the lower lead support member mounting part 511 have spaces 522 and 512 formed therein, respectively, so that the upper lead holding member 42 and the lower lead holding member 41 can freely move in both the X- and Y-axis directions in the spaces 522 and 512.

Figure 6:
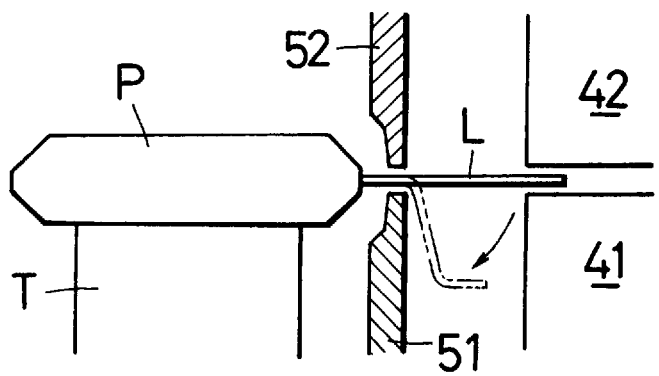
FIG. 6 shows the way in which a lead of an electronic component is bent.

FIG. 6 shows the way in which a lead of an electronic component P is bent. The electronic component P is positioned and fixedly supported on a table T. The table T holds the electronic component P by vacuum or the like and has an indexing function whereby a lead L of the electronic component P that is to be worked is indexed to a working position. With the root portion of the lead L press-supported by the lead support fixed member 51 and the lead support movable member 52, the distal end portion of the lead L is clamped between the lower lead holding member 41 and the upper lead holding member 42. Then, the X-axis servomotor 21 and the Y-axis servomotor 31 are controlled such that the lower lead holding member 41 and the upper lead holding member 42 draw a circular arc-shaped locus as shown in the figure, thereby bending the lead L.

Figure 7:
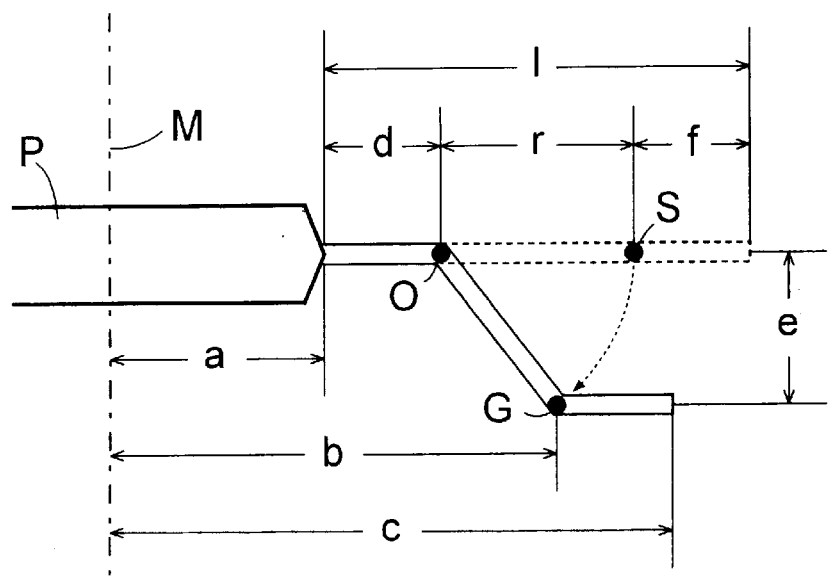
FIG. 7 shows dimensions of various portions of a bend shape of a lead of an electronic component.

FIG. 7 shows the dimensions of each part of a bend shape of the lead L of the electronic component P. The electronic component P is positioned on the table such that the center of the electronic component P is coincident with the center line M of the table. The dimension a of the electronic component P from the center thereof to the root portion of the lead L and the dimension l, which indicates the length of the lead L, are dimensions determined according to the type of electronic component. The bend shape of the lead L is determined by the dimensions b, c, d and e. However, because the dimensions a and l have already been determined according to the type of electronic component, if the values of three of the dimensions b, c, d and e are specified, the other dimension is automatically determined. For example, if the dimensions b, d and e are specified, the dimension c is determined as follows:

$$r=\{(b-a-d)^2+e^2\}^{1/2}$$ Eq. 1

$$f=l-d-r$$ Eq. 2

$$c=b+f$$

Accordingly, if the values of the dimensions b, d and e are specified by inputting them from an input device, the position O where the root portion of the lead is supported by the lead support device and the position S where the distal end portion of the lead is held by the lead holding device can be calculated according to Eq. 1 and Eq. 2. It is also possible to calculate the radius r of a circular arc-shaped locus along which the lead holding device holding the distal end portion of the lead moves. In other words, the lead root portion is fixedly supported at the position O, and the lead distal end portion is held at a portion thereof closer to the distal end than the position S and moved along a circular arc centered at the position O and having a radius r from the locus starting position S to the locus terminating position G. A circular arc-shaped locus can also be calculated by specifying the values of three of the dimensions b, c, d and e other than those mentioned above. Other specifying methods may also be employed. For example, it is also possible to specify the dimensions d, r and e instead of specifying the values of three of the dimensions b, c, d and e.

Figure 8:
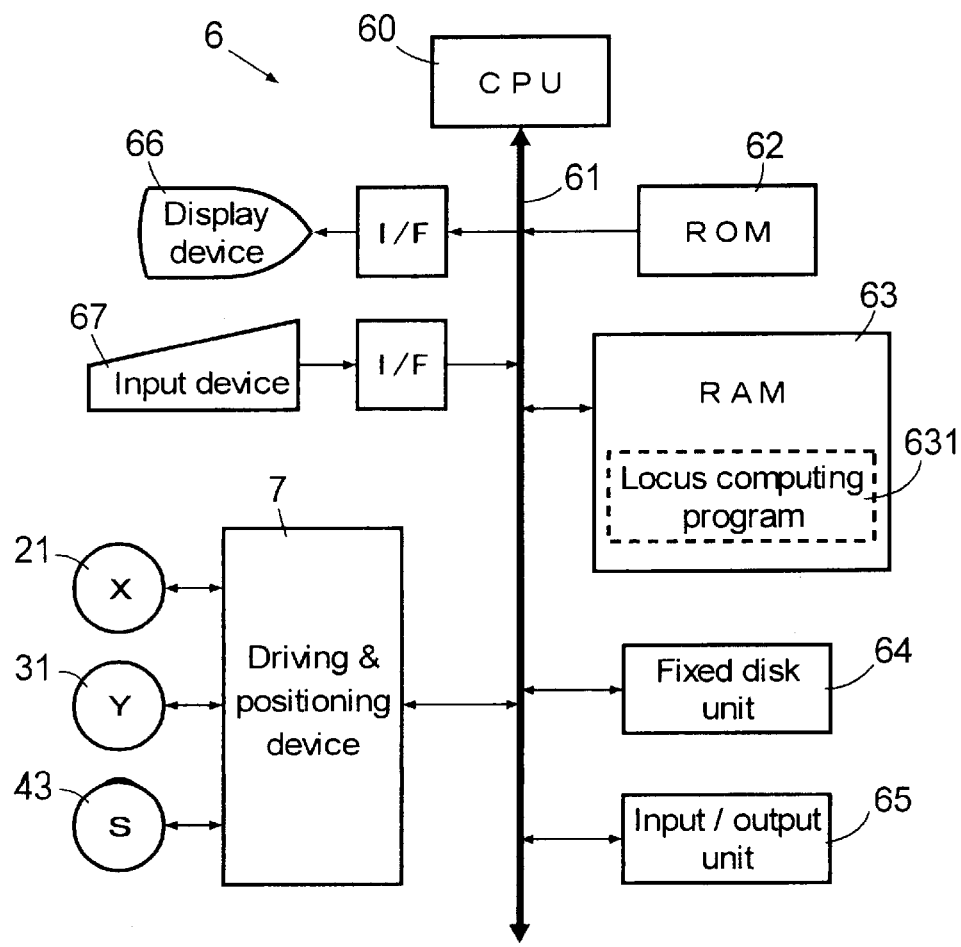
FIG. 8 is a diagram showing the arrangement of a controller of the lead bending machine for electronic components.

The lead bending machine for electronic components is controlled by a controller 6 as shown in FIG. 8. As the controller 6, a numerical control system, a programmable controller, etc. can be used. The controller 6 has a CPU 60 to execute various kinds of data processing. A ROM 62, a RAM 63, and a fixed disk unit 64 are connected to the CPU 60 through a bus 61. The CPU 60 operates according to a system program and data stored in the ROM 62 and a program and data loaded into the RAM 63.

The RAM 63 contains a locus computing program 631 for calculating each parameter of a circular arc-shaped locus according to Eqs. 1 and 2 from data concerning the dimensions b, d, e, etc. inputted by the operator. The fixed disk unit 64 contains various application programs and the locus computing program 631 loaded into the RAM 63 so as to be executed by the CPU 60, together with dimension patterns of lead bend shapes pre-entered according to the type of electronic component. An input/output unit 65 is a flexible disk unit, a paper tape reader, etc., whereby pre-entered dimension patterns of a lead bend shape prepared in advance can be read from an external storage medium, e.g. a flexible disk, and conversely, the dimension patterns of a lead bend shape in the controller 6 can be saved to an external storage medium.

A display device 66 and an input device 67 are connected to the bus 61 of the controller 6 through respective interface circuits, thereby allowing information to be inputted and outputted through interaction with the operator. As the display device 66, a CRT, a liquid-crystal display panel, etc. can be used. As the input device 67, a keyboard, etc. can be used. With the input device 67, the operator inputs various dimensions to specify a lead bend shape or selects pre-entered dimension patterns to specify a lead bend shape. The controller 6 sends commands to a driving and positioning device 7 according to various parameters of a circular arc-shaped locus calculated from the lead bend shape and a predetermined procedure to effect driving and positioning control for the X-axis servomotor 21, the Y-axis servomotor 31 and the cylinder device 43.

Figure 9:
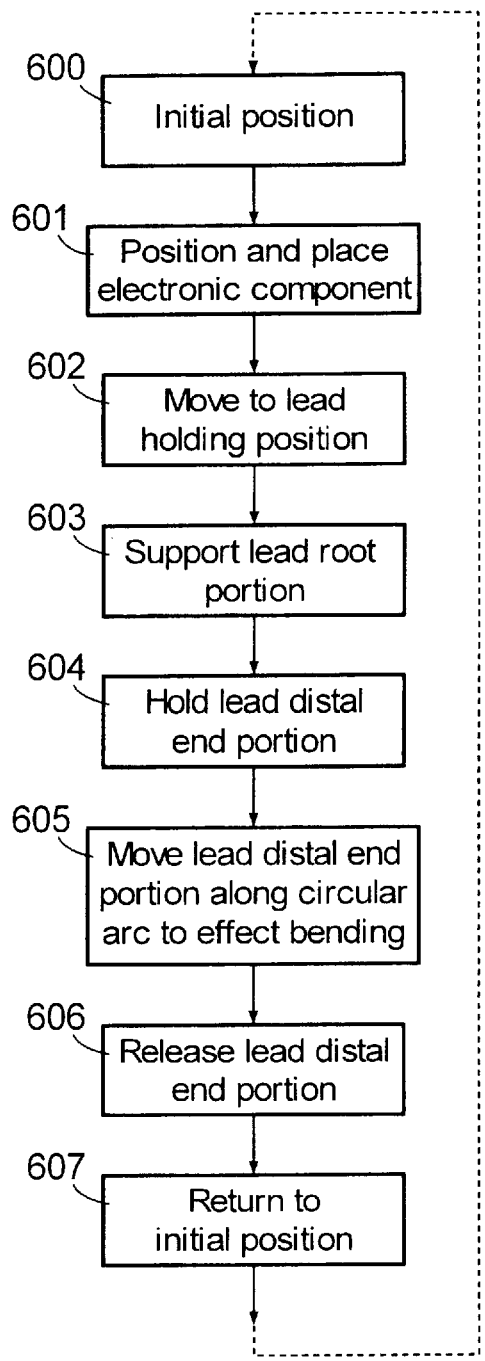
FIG. 9 is a chart showing the sequence of motions of the lead bending machine for electronic components.

FIG. 9 is a chart showing the sequence of motions of the lead bending machine for electronic components. In motion 600, each part of the machine is in its initial position, and the X-axis servomotor 21, the Y-axis servomotor 31 and the cylinder device 43 are not in action. Next, in motion 601, the electronic component P is positioned and placed on the table T. Next, in motion 602, the X-axis servomotor 21 and the Y-axis servomotor 31 are driven to move the lower lead holding member 41 and the upper lead holding member 42 to a position for holding the distal end of the lead L in a state where the lower lead holding member 41 and the upper lead holding member 42 are open, thereby positioning them. Next, in motion 603, the Y-axis servomotor 31 is driven to urge the lead support movable member 52 toward the lead support fixed member 51, thereby fixedly supporting the root position of the lead L. Position setting has previously been made such that when the root of the lead L is fixedly supported, the lower lead holding member 41 is located at the starting point of the circular arc-shaped locus.

Next, in motion 604, the cylinder device 43 is driven to urge the upper lead holding member 42 toward the lower lead holding member 41, thereby holding the distal end portion of the lead L. Next, in motion 605, the X-axis servomotor 21 and the Y-axis servomotor 31 are driven to cause both the lower lead holding member 41 and the upper lead holding member 42 to move along the calculated circular arc-shaped locus in a state where the distal end of the lead L is held therebetween, thereby bending the lead L into a predetermined shape. During this operation, the driving roller 56 also moves in association with the movement of the lower lead holding member 41 and the upper lead holding member 42. However, because the movement of the driving roller 56 is absorbed by the spring 55, there is no likelihood that the fixedly supported root position of the lead L will disengage from the lead support device. Next, in motion 606, the cylinder device 43 is opened to release the distal end of the lead L from the hold. Finally, in motion 607, the Y-axis servomotor 31 is driven to release the lead root portion from the support, and the lower lead holding member 41 and the upper lead holding member 42 are returned to their initial positions by the X-axis servomotor 21 and the Y-axis servomotor 31. By repeating the above-described motions, leads of electronic components are bent.

Although in this embodiment the lower lead holding member 41 and the lead support movable member 52 are driven in interlocked relation to each other by a single ball screw having threads cut on the upper and lower portions thereof in inverse relation to each other, it should be noted that the lower lead holding member 41 and the lead support movable member 52 need not necessarily be driven by such a driving mechanism. It is also possible to use a driving mechanism that drives the lower lead holding member 41 and the lead support movable member 52 independently of each other.

With the foregoing arrangement, the present invention provides the following advantageous effects:

The lead bending machine according to the present invention can deal with various lead bend shapes of a great variety of electronic components as a general-purpose machine without a need of changing benders. Therefore, bending can be carried out with a high degree of efficiency. Moreover, it is also easy to deal with a new type of electronic components.

By inputting bend shape dimensions of leads of electronic components, each parameter of a locus of travel for a lead bending operation is automatically calculated to carry out bending. Therefore, the machine is easy to operate and can be operated by anyone.

In the arrangement wherein the movement along the Y-axis of the lead holding device holding the lead distal end portion and the urging drive for the lead support device supporting the lead root portion are caused by driving a single ball screw having threads cut thereon in inverse relation to each other, the number of control axes can be reduced, and the arrangement of the controller can be simplified. Thus, the costs can be reduced.

Although the present invention has been described through specific terms, it should be noted here that the described embodiments are not necessarily exclusive and that various changes and modifications may be imparted thereto without departing from the scope of the invention which is limited solely by the appended claims.

What is claimed is:

1. A machine for holding electronic components with leads to be bent attached thereto and for holding said electronic components and said leads while said leads are being bent, said machine comprising:

holding means for holding a distal end portion of a lead of an electronic component to be bent;

lead support means for supporting a root portion of the lead of said electronic component in a fixed state;

a first driving mechanism for causing said lead holding means to move along a first axis of travel on said machine;

a second driving mechanism for causing said lead holding means to move along a second axis of travel perpendicularly intersecting said first axis of travel;

control means for controlling said first driving mechanism and said second driving mechanism such that said lead holding means holding said distal end portion of said lead of said electronic component moves along an approximately circular arc-shaped locus relative to said lead support means supporting said root portion of said lead of said electronic component, thereby bending said lead of said electronic component between said root portion and said distal end portion;

said lead holding means comprises a first lead holding member and a second lead holding member, which are movable toward and away from each other;

said first driving mechanism includes a ball screw and a ball nut, and said second driving mechanism includes a ball screw and a ball nut for driving said first lead holding member, said lead bending machine further comprising a cylinder device for urging said second lead holding member toward said first lead holding member.

2. A lead bending machine for electronic components according to claim 1, further comprising lead support means for supporting a root portion of the lead of said electronic component in a fixed state.

3. A lead bending machine for electronic components according to claim 2, wherein said lead support means comprises a lead support fixed member, and a lead support movable member movable toward and away from said lead support fixed member.

4. A lead bending machine for electronic components according to claim 3, further comprising a third driving mechanism for causing said lead support movable member to move toward said lead support fixed member along said second axis of travel.

5. A lead bending machine for electronic components according to claim 4, wherein said third driving mechanism includes a ball screw and a ball nut; and said ball screw of said second driving mechanism and said ball screw of said third driving mechanism are integral with each other and have respective threads cut thereon in inverse relation to each other and with the same pitch.

6. A lead bending machine for electronic components according to any one of claim 1–3 further comprising:

input means for inputting dimensions of a bend shape of the lead of said electronic component; and computing means for arithmetically determining a lead holding position of said lead holding means and a circular arc-shaped locus of travel from data concerning the dimensions inputted from said input means.

* * * * *